United States Patent
Kim et al.

(10) Patent No.: US 9,611,547 B2
(45) Date of Patent: Apr. 4, 2017

(54) METHOD AND APPARATUS FOR FORMING THIN OXIDE FILM

(71) Applicant: Industry-Academic Cooperation Foundation, Yonsei University, Seoul (KR)

(72) Inventors: Hyungjun Kim, Seoul (KR); Taewook Nam, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 15/069,842

(22) Filed: Mar. 14, 2016

(65) Prior Publication Data
US 2016/0273107 A1    Sep. 22, 2016

(30) Foreign Application Priority Data
Mar. 18, 2015    (KR) .................. 10-2015-0037374

(51) Int. Cl.
| C23C 16/455 | (2006.01) |
| H01L 21/02 | (2006.01) |
| H01L 21/285 | (2006.01) |
| C23C 16/448 | (2006.01) |
| C23C 16/40 | (2006.01) |

(52) U.S. Cl.
CPC ...... *C23C 16/45553* (2013.01); *C23C 16/403* (2013.01); *C23C 16/405* (2013.01); *C23C 16/4488* (2013.01); *H01L 21/0228* (2013.01); *H01L 21/02181* (2013.01); *H01L 21/02183* (2013.01); *H01L 21/02186* (2013.01); *H01L 21/02189* (2013.01); *H01L 21/02205* (2013.01); *H01L 21/28556* (2013.01); *H01L 21/0262* (2013.01); *H01L 21/02554* (2013.01); *H01L 21/02565* (2013.01)

(58) Field of Classification Search
CPC .......... C23C 16/45553; C23C 16/4488; C23C 16/403; C23C 16/405; H01L 21/28556; H01L 21/02186; H01L 21/02205; H01L 21/0228; H01L 21/02189; H01L 21/02183; H01L 21/02181; H01L 21/02565; H01L 21/0262
See application file for complete search history.

(56) References Cited

U.S. PATENT DOCUMENTS

| 6,303,034 B1 * | 10/2001 | Kamiya | .................... C02F 1/78 |
| | | | 210/143 |
| 2004/0086434 A1 * | 5/2004 | Gadgil | .............. H01J 37/32009 |
| | | | 422/186.04 |
| 2009/0162551 A1 * | 6/2009 | Zilbauer | ............... C23C 16/405 |
| | | | 427/255.28 |

FOREIGN PATENT DOCUMENTS

| KR | 2001-0039874 A | 5/2001 |
| KR | 10-0715074 B1 | 5/2007 |
| KR | 2011-0080458 A | 7/2011 |
| KR | 2012-0073201 A | 7/2012 |
| WO | 2011/019950 A1 | 2/2011 |

* cited by examiner

*Primary Examiner* — Kyoung Lee
(74) *Attorney, Agent, or Firm* — Carter, DeLuca, Farrell & Schmidt, LLP

(57) ABSTRACT

Disclosed is a method and apparatus for forming a thin oxide film. The method includes reacting metallic precursors with a reactant, which contains an OH radical, to form the thin oxide film on a substrate.

11 Claims, 2 Drawing Sheets

| Oxygen source | Electrochemical potential[V] |
|---|---|
| $OH^-$ | 2.80 |
| $O_3$ | 2.08 |
| $H_2O_2$ | 1.78 |
| $O_3$ | 1.23 |

METHOD AND APPARATUS FOR FORMING THIN OXIDE FILM

CROSS-REFERENCE TO RELATED APPLICATIONS

A claim for priority under 35 U.S.C. §119 is made to Korean Patent Application No. 10-2015-0037374 filed Mar. 18, 2015, in the Korean Intellectual Property Office, the entire contents of which are hereby incorporated by reference.

BACKGROUND

Embodiments of the inventive concept described herein relate to a method and apparatus for forming a thin oxide film, and more particularly, relate to a method and apparatus for forming a thin oxide film using an OH radical.

There are generally known methods of depositing thin oxide films, such as chemical vapor deposition and atomic layer deposition. Those deposition methods are preformed for thin oxide films through coincident or sequential ejection with precursors and reactants.

General methods of thin film deposition usually require high process temperature, UV irradiation, or plasma process, being disadvantageous in cost. Furthermore, in the case of irradiating UV through a UV lamp to form a thin oxide film, a thin film is also generated in the UV lamp and thereby the efficiency of UV irradiation is degraded. For that reason, it is necessary to prepare a new thin-film deposition process for high-quality thin films without a UV lamp or plasma apparatus in low unit cost of process.

SUMMARY

One aspect of embodiments of the inventive concept is directed to provide a method and apparatus for forming a thin oxide film with high quality in a low processing cost.

Additionally, another aspect of embodiments of the inventive concept is directed to provide a method and apparatus for forming a thin oxide film with high quality without a plasma process or high-temperature heat treatment.

Problems to be solved by embodiments of the inventive concept may not be restrictive hereto. Other problems or directions will become apparent to those skilled in the art from the following detailed description.

A method for forming a thin oxide film may include forming the thin oxide film on a substrate by reacting metallic precursors with a reactant, which contains an OH radical.

A method of forming a thin oxide film may include supplying metallic precursors to the substrate and supplying a reactant, which contains an OH radical, to the substrate.

In an embodiment, the supplying of the reactant, which contains the OH radical, to the substrate may include generating the OH radical using ozone and hydrogen peroxide.

In an embodiment, the generating of the OH radical may include supplying ozone, supplying hydrogen peroxide, and reacting the ozone and the hydrogen peroxide to generate the OH radical.

In an embodiment, the supplying of the ozone may include supplying a gaseous ozone under 15° C. to 25° C.

In an embodiment, the supplying of the hydrogen peroxide may include supplying the hydrogen peroxide that is evaporated from 5-to-100% concentrated hydrogen peroxide water.

In an embodiment, the forming of the thin oxide film may repeatedly include supplying the metallic precursors to the substrate and supplying the reactant, which contains the OH radical, to the substrate.

In an embodiment, the forming of the thin oxide film may include introducing a thin oxide film into a chamber, supplying the metallic precursors into the chamber, supplying a purge gas into the chamber, supplying the reactant, which contains the OH radical, into the chamber, and supplying a purge gas into the chamber.

In an embodiment, the substrate may be a silicon substrate or a silicon oxide substrate.

In an embodiment, the metallic precursors may include trimethylaluminum (TMA) and other Al precursors, tris (dimethylmaino)cyclopentadienyl zirconium, tetrakisdiethylamido zirconium (TEMAZr) and other Zr precursors, tetrakisdimethylamido titanium (TDMATi) and other Ti precursors, demethyl zinc and other Zn precursors, pentaetoxy tantalum (PET) and other Ta precursors, tetrakixdimethylamido hafnium (TDMAHf) and other Hf precursors, trimethyl(methykcyclopentadienyl) platinum and other Pt precursors, tris-(2,2,6,6,-tetramethyl-3,5-heptanedinate) Fe(III) and other Fe precursors, tungsten haxacarbonyl and other W precursors, nickel cyclopentadienyl and other Ni precursors, tetrakisdimethylamino Tin (TDMASn) and other Sn precursors. Trimethyl gallium (TMG) and other Ga precursors, tetramethyl germanium (TMGe) and other Ge precursors, trimethyl indium (TMIn) and other In precursors, silicon tetrachloride and other Si precursors, or a mixture of them.

An apparatus for forming a thin oxide film may include a chamber, a precursor supply part configured to supply metallic precursors into the chamber, and a reactant supply part configured to supply a reactant, which contains an OH radical, into the chamber.

In an embodiment, the reactant supply part may include a first supply part configured to supply ozone, and a second supply part configured to supply hydrogen peroxide.

The reactant supply part further may include an OH-radical generation part connected with the first supply part and the second supply part and configured to react the ozone with the hydrogen peroxide to generate an OH radical that is to be supplied into the chamber.

The first supply part may supply the ozone in a gaseous state under 15° C. to 25° C.

In an embodiment, the second supply part may supply hydrogen peroxide that is evaporated from 5-to-100% concentrated hydrogen peroxide water.

In an embodiment, the second supply part may further include a heating unit to generate hydrogen peroxide by heating 5-to-100% concentrated hydrogen peroxide water.

BRIEF DESCRIPTION OF THE FIGURES

The above and other objects and features will become apparent from the following description with reference to the following figures, wherein like reference numerals refer to like parts throughout the various figures unless otherwise specified, and wherein.

Advantageous effects by embodiments of the inventive concept may not be restrictive hereto. Other advantageous effects will become apparent to those skilled in the art from the following detailed description.

DETAILED DESCRIPTION

Other aspects, advantages, and salient features of the inventive concept will become apparent to those skilled in the art from the following detailed embodiments. Embodiments described herein, however, may not be intentionally confined in specific embodiments, but should be construed as including diverse modifications, equivalents, and/or alternatives. Embodiments are merely provided to help those skilled in the art to clearly understand the technical scope of the inventive concept and the inventive concept may be only defined by the scope of the annexed claims.

Unless otherwise defined herein, all the terms used herein (including technical or scientific terms) may have the same meaning that is generally acceptable by universal technology in the related art of the inventive concept. It will be further understood that terms, which are defined in a dictionary and commonly used, may also be interpreted as is customary in the relevantly related art and/or as is same in the description of the present application. Even in the case of terminological expression with insufficient clarification, such terms may not be conceptualized or overly interpreted in formality. General descriptions about known configurations may be omitted to prevent vagueness on the point of the inventive concept.

In the description, the terms of a singular form may also include plural forms unless otherwise specified. The terms 'include' and/or its diverse inflections or conjugations, for example, 'inclusion', 'including', 'includes', or 'included', as used herein, may be construed such that any one of a constitution, a component, an element, a step, an operation, and/or a device does not exclude presence or addition of one or more different constitutions, components, elements, steps, operations, and/or devices. The terms 'on', or its conjugations, as used herein, may be construed such that any one of a constitution, a component, an element, a step, an operation, and/or a device does not exclude presence or addition of one or more different constitutions, components, elements, steps, operations, and/or devices. In the description, the term 'and/or' may indicate individuals or diverse combinations with elements enumerated therein.

Now embodiments of the inventive concept will be described hereinafter in conjunction with the accompanied drawings.

Figure 1:
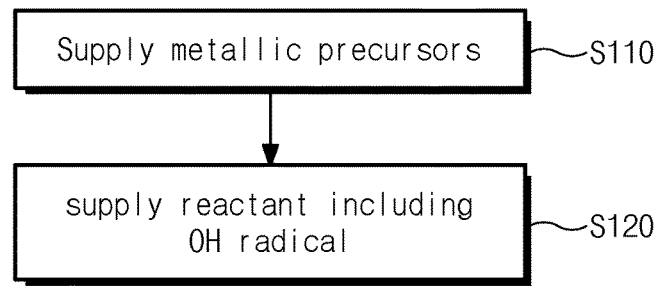
FIG. 1 is an exemplary flow chart showing a method for forming a thin oxide film according to an embodiment of the inventive concept.

FIG. 1 is an exemplary flow chart showing a method 100 for forming a thin oxide film according to an embodiment of the inventive concept. The method 100 for forming a thin oxide film may include a step of supplying metallic precursors (S110) and a step of supplying a reactant which contains an OH radical (S120). The OH radical included in the reactant may act as an oxidizer of the metallic precursors.

In an embodiment, the metallic precursors may include trimethylaluminum (TMA) and other Al precursors, tris (dimethylmaino)cyclopentadienyl zirconium, tetrakisdiethylamido zirconium (TEMAZr) and other Zr precursors, tetrakisdimethylamido titanium (TDMATi) and other Ti precursors, demethyl zinc and other Zn precursors, pentaetoxy tantalum (PET) and other Ta precursors, tetrakixdimethylamido hafnium (TDMAHf) and other Hf precursors, trimethyl(methykcyclopentadienyl) platinum and other Pt precursors, tris-(2,2,6,6,-tetramethyl-3,5-heptanedionate) Fe(III) and other Fe precursors, tungsten haxacarbonyl and other W precursors, nickel cyclopentadienyl and other Ni precursors, tetrakisdimethylamino Tin (TDMASn) and other Sn precursors. Trimethyl gallium (TMG) and other Ga precursors, tetramethyl germanium (TMGe) and other Ge precursors, trimethyl indium (TMIn) and other In precursors, silicon tetrachloride and other Si precursors, or a mixture of them, but may not be restrictive hereto.

A method for forming a thin oxide film according to an embodiment of the inventive concept may form a thin oxide film on a substrate through chemical vapor deposition. During chemical vapor deposition, it may be allowable to coincidently execute a step of supplying metallic precursors and a step of supplying a reactant which contains an OH radical.

A method for forming a thin oxide film according to another embodiment of the inventive concept may form a thin oxide film on a substrate through atomic layer deposition. During atomic layer deposition, it may sequentially execute a step of supplying metallic precursors and a step of supplying a reactant which contains an OH radical.

In detail, a method for forming a thin oxide film through atomic layer deposition according to another embodiment of the inventive concept may include steps of introducing a substrate into a chamber, supplying the metallic precursors into the chamber after introducing the substrate, supplying a purge gas into the chamber after supplying the metallic precursors, supplying the reactant, which contains the OH radical, into the chamber, and supplying a purge gas into the chamber after supplying the reactant.

In an embodiment, base pressure in a chamber may be controlled in 8 mtorr and processing pressure may be controlled in 50 to 100 mtorr.

In an embodiment, ejection pressure in ejecting metallic precursors and a reactant, which contains an OH radical, into a chamber may be controlled in 100 to 1000 mtorr.

In an embodiment, for forming a thin oxide film by atomic layer deposition, a process of ejecting metallic precursors for 2 seconds, ejecting a purge gas for 5 seconds, ejecting a reactant, which contains an OH radical, for 2 seconds, and ejecting a purge gas again for 5 seconds may repeated to form the thin oxide film. These processing times may be variable by equipment or pump.

A method for forming a thin oxide film according to an embodiment of the inventive concept may form the thin oxide film with a desired thickness by repeating steps of supplying metallic precursors (S110) and supplying a reactant containing an OH radical (S120) in a plurality of times.

At the step S110, the aforementioned precursors may be used as metallic precursors to be supplied to the substrate. During this, the metallic precursors may be supplied on a gaseous state. TMA may be supplied at temperature 15° C. to 25° C., ZyALD may be supplied at temperature equal to or higher than 40° C., TDMAT may be supplied at temperature equal to or higher than 50° C., demethyl zinc may be supplied at temperature 15° C. to 25° C., TDMAZr may be supplied at temperature equal to or higher than 45° C., PET may be supplied at temperature equal to or higher than 100° C., and TDMAHf may be supplied at temperature equal to or higher than 40° C. In an embodiment of the inventive concept, partial pressure of metallic precursors in a chamber may be 0.01 torr to 0.1 torr.

As described above, metallic precursors usable in oxide deposition according to an embodiment of the inventive concept may not be restrictive the aforementioned precursors. Even other known metallic precursors may be used in chemical vapor deposition or atomic layer deposition.

At the step S120, a reactant containing an OH radical may be supplied to a substrate. In an embodiment of the inventive concept, partial pressure of a reactant on a chamber may be 0.01 torr to 0.1 torr.

According to an embodiment of the inventive concept, the step of supplying a reactant containing an OH radical (S120) may further include a step of generating an OH radical.

Figure 2:
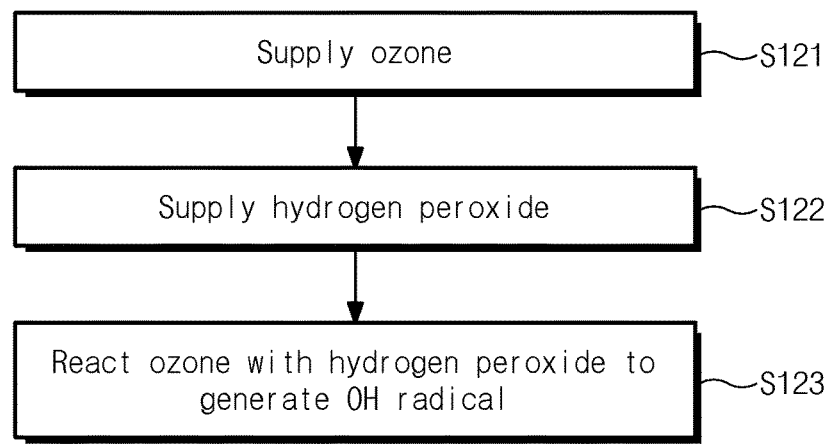
FIG. 2 is an exemplary flow chart showing a method for generating an OH radical according to an embodiment of the inventive concept.

FIG. 2 is an exemplary floe chart showing a method for generating an OH radical according to an embodiment of the inventive concept.

A method for depositing a thin oxide film according to an embodiment of the inventive concept may generate an OH radical and may use the OH radical for an oxidizer of metallic precursors. A method for depositing a thin oxide film according to an embodiment of the inventive concept may include steps of supplying ozone (S121), supplying hydrogen peroxide (S122), and generating an OH radical in reaction with the ozone and the hydrogen peroxide (S123).

At the step S121, ozone may be supplied in a gaseous state under temperature 15° C. to 25° C. At the step S122, Hydrogen may be supplied in a gaseous state by heating hydrogen peroxide water with concentration 5% to 100%. Ozone and hydrogen peroxide may generate an OH radical in reaction with Formula 1 given as follows.

$$H_2O_2 + 2O_3 \rightarrow OH^+ + 2O_1 + H^+ + O_3^-$$ [Formula 1]

As shown in Formula 1, an OH radical generated from reaction with hydrogen peroxide and ozone may have a high electrochemical potential of +2.8V. An OH radical may be used as an oxidizer having high oxidation power.

In a method for forming a thin oxide film according to an embodiment of the inventive concept, since an OH radical generated from reaction with ozone and hydrogen peroxide is used as an oxidizer, it may be accomplishable to form a thin oxide film of high quality even without additional plasma equipment or UV lamp equipment.

In a general case of using a UV lamp to form a thin oxide film, a thin film is also inadvertently formed on the UV lamp and thereby the efficiency of deposition becomes lower as long as the process is running. Differently, in a method for forming a thin oxide film according to an embodiment of the inventive concept, since an oxidizer is obtained by reacting ozone and hydrogen peroxide without a UV lamp, it may be avoidable from such a problem during deposition.

Figures 3, 4:
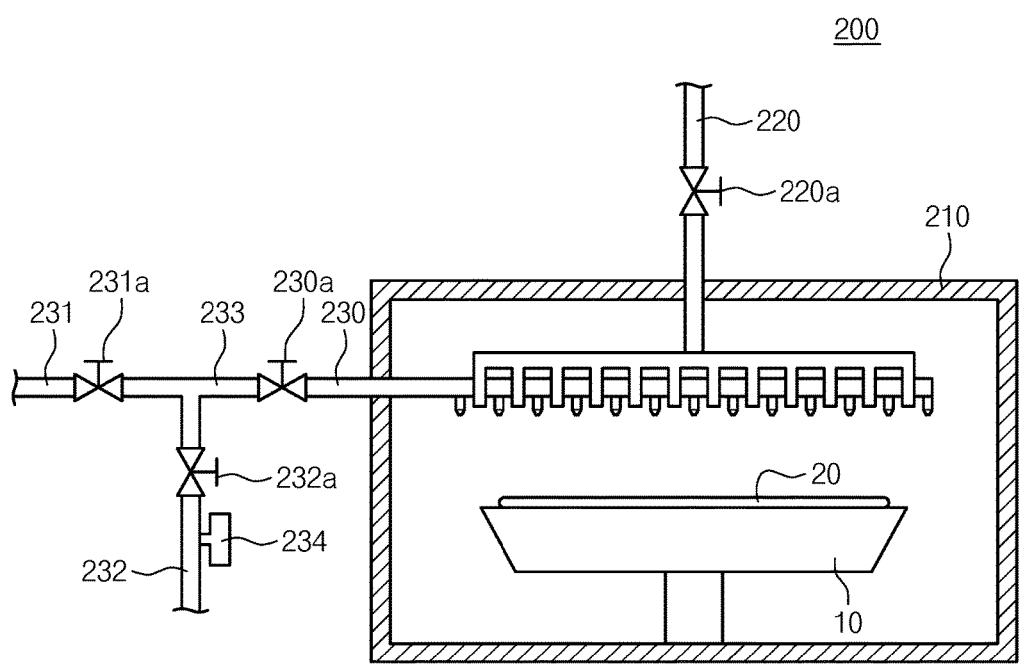
FIG. 3 is a table comparing electrochemical potentials between general oxidizers and an OH radical which is generated according to an embodiment of the inventive concept.
FIG. 4 is an exemplary schematic diagram illustrating an apparatus for forming a thin oxide film according to an embodiment of the inventive concept.

FIG. 3 is a table comparing electrochemical potentials between general oxidizers and an OH radical which is generated according to an embodiment of the inventive concept.

Referring to FIG. 3, it can be seen that an OH radical is higher than ozone ($O_3$), hydrogen peroxide ($H_2O_2$) and oxygen ($O_2$) in electrochemical potential. An OH radical, as an oxidizer generated according to an embodiment of the inventive concept may be higher than ozone in oxidation power and may be used as an oxidizer capable of obtaining a more excellent oxide film in high quality.

FIG. 4 is a schematic diagram illustrating an apparatus 200 for forming a thin oxide film according to an embodiment of the inventive concept. Referring to FIG. 4, the apparatus 200 for forming a thin oxide film may include a chamber 210, a precursor supply part 220 for supplying precursors into the chamber 200, and a reactant supply part 230 for supplying a reactant, which contains an OH radical, into the chamber 200. The apparatus 200 for forming a thin oxide film may form the thin oxide film through chemical vapor deposition or atomic layer deposition.

The chamber 210 may include a processing space which is supplied with metallic precursors and a reactant including an OH radical. An inner space of the chamber 210 may be provided with a substrate support 10. A substrate 20, on which a thin oxide film is formed, may be provided on the substrate support 10. The substrate 20 may be a silicon substrate or a silicon oxide substrate, but embodiments of the inventive concept may not be restrictive hereto.

The precursor supply part 220 may supply metallic precursors into the chamber 210. Metallic precursors to be supplied may be made of trimethylaluminum (TMA) and other Al precursors, tris(dimethylmaino)cyclopentadienyl zirconium, tetrakisdiethylamido zirconium (TEMAZr) and other Zr precursors, tetrakisdimethylamido titanium (TD-MATi) and other Ti precursors, demethyl zinc and other Zn precursors, pentaetoxy tantalum (PET) and other Ta precursors, tetrakixdimethylamido hafnium (TDMAHf) and other Hf precursors, trimethyl(methykcyclopentadienyl) platinum and other Pt precursors, tris-(2,2,6,6,-tetramethyl-3,5-heptanedionate) Fe(III) and other Fe precursors, tungsten haxacarbonyl and other W precursors, nickel cyclopentadienyl and other Ni precursors, tetrakisdimethylamino Tin (TD-MASn) and other Sn precursors. Trimethyl gallium (TMG) and other Ga precursors, tetramethyl germanium (TMGe) and other Ge precursors, trimethyl indium (TMIn) and other In precursors, silicon tetrachloride and other Si precursors, or a mixture of them, but embodiments of the inventive concept may not be restrictive hereto. In an embodiment, an amount of metallic precursors supplied into the chamber 210 from the precursor supply part 220 may be adjusted through a valve 220a which is installed at the precursor supply part 220. In an embodiment, partial pressure of metallic precursors in the chambern 210 may be adjusted in 0.01 torr to 0.1 torr through the valve 220a.

The reactant supply part 230 may supply a reactant, which contains an OH radical, into the chamber 210. In an embodiment, an amount of a reactant supplied into the chamber 210 from the reactant supply part 230 may be adjusted through a valve 230a which is installed at the reactant supply part 230. In an embodiment, partial pressure of a reactant in the chamber 210 may be adjusted in 0.01 torr to 0.1 torr through the valve 230a.

Referring to FIG. 4, the reactant supply part 230 may include a first supply part 231 for supplying ozone, and a second supply part 232 for supplying hydrogen peroxide.

The first supply part 231 may supply ozone in a gaseous state. The first supply part 231 may supply ozone in a gaseous state at temperature 15° C. to 25° C. In an embodiment, an amount of ozone supplied from the first supply part 231 may be adjusted through a valve 231a which is installed at the first supply part 231.

The second supply part 232 may supply hydrogen peroxide which is evaporated from hydrogen peroxide water with concentration 5% to 100%. An amount of hydrogen peroxide supplied from the second supply part 230 may be adjusted through a valve 232a which is installed at the second supply part 232.

Referring to FIG. 4, the second supply part 232 mat further include a heating unit 234 for heating and evaporating hydrogen peroxide. The second supply part 234 may use the heating unit 234 to heat hydrogen peroxide water and then may supply hydrogen peroxide which is evaporated from the hydrogen peroxide water.

Referring to FIG. 4, the reactant supply part 230 may include an OH-radical generation part 233 for reacting ozone and hydrogen peroxide to generate an OH radical. In an embodiment, the OH-radical generation part 233 may be connected with the first supply part 231 and the second supply part 232, may be supplied with ozone from the first supply part 231, and may be supplied with hydrogen peroxide from the second supply part 232.

In the OH-radical generation part 233, ozone reacts with hydrogen peroxide, according to Formula 1, to generate an OH radical. In an embodiment of the inventive concept, the reactant supply part 230 may generate an OH radical in the OH-radical generation part 233 and then may supply the Oh radical into the chamber 210.

In an embodiment of the inventive concept, a thin oxide film including one molecule layer or a stack of a multiplicity of molecule layers may be formed on the substrate 20 by repeating, in plurality of times, steps of supplying metallic precursors from the precursor supply part 220 and supplying a reactant, which contains an OH radical, from the reactant supply part 230.

The apparatus 200 for forming a thin oxide film according to an embodiment of the inventive concept may form a thin oxide film in high quality even without additional plasma equipment or UV lamp.

Embodiment 1

The inventor conducted an experiment for forming a thin oxide film on a substrate through atomic layer deposition.

A substrate was provided on a substrate support in a chamber for atomic layer deposition and then heat up to temperature of 250° C. During this, a silicon oxide substrate, which was an insulator, was used as the substrate. Trimethylaluminum (TMA) was injected into the chamber for 2 seconds under 20° C. During this, partial pressure of precursors in the chamber was set in 0.1 torr. After supplying precursors, a purge gas was injected into the chamber for 5 seconds to purge the chamber. The purge gas was used with argon (Ar).

After the pursing, a reactant including an OH radical was injected into the chamber for 2 seconds and partial pressure of the reactant in the chamber was set in 0.1 torr.

The reactant employed in the experiment was generated through the following course. There was used a mixture with ozone gas of 20° C. and hydrogen peroxide of 50° C. which was evaporated from hydrogen peroxide water of 5% concentration. The ozone and the hydrogen peroxide react with each other to form the reactant containing the OH radical.

After supplying the reactant, argon gas was injected into the chamber for 5 seconds to purge the chamber.

Defining one cycle as a process of reacting the precursors with the reactant, the cycle was repeated by 200 times to form a thin aluminum oxide film in thickness about 40 nm.

Embodiment 2

The inventor conducted another experiment for forming a thin oxide film on a substrate through atomic layer deposition.

A substrate was provided on a substrate support in a chamber for atomic layer deposition and then heat up to temperature of 250° C. During this, a silicon oxide substrate, which was an insulator, was used as the substrate. Tetrakisdimethylamido hafnium (TDMAHf) was injected into the chamber for 2 seconds under 20° C. During this, partial pressure of precursors in the chamber was set in 0.1 torr. After supplying precursors, a purge gas was injected into the chamber for 5 seconds to purge the chamber. The purge gas was used with argon (Ar).

After the pursing, a reactant including an OH radical was injected into the chamber for 2 seconds and partial pressure of the reactant in the chamber was set in 0.1 torr.

The reactant employed in the experiment was generated through the following course. There was used a mixture with ozone gas of 20° C. and hydrogen peroxide of 50° C. which was evaporated from hydrogen peroxide water of 5% concentration. The ozone and the hydrogen peroxide react with each other to form the reactant containing the OH radical.

After supplying the reactant, argon gas was injected into the chamber for 5 seconds to purge the chamber.

Defining one cycle as a process of reacting the precursors with the reactant, the cycle was repeated by 200 times to form a thin hafnium oxide film in thickness about 40 nm.

According to an embodiment of the inventive concept, it may be accomplishable to obtain a thin oxide film with high quality in a low processing cost.

Additionally, it may be allowable to obtain a thin oxide film with high quality without a plasma process or high-temperature heat treatment.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for forming a thin oxide film, the method comprising:
    forming the thin oxide film on a substrate by reacting metallic precursors with a reactant, which contains an OH radical,
    wherein the forming of the thin oxide film comprises:
        supplying the metallic precursors to the substrate; and
        supplying the reactant, which contains the OH radical, to the substrate,
    wherein the supplying of the reactant, which contains the OH radical, to the substrate comprises:
        generating the OH radical using ozone and hydrogen peroxide,
    wherein the generating of the OH radical comprises:
        supplying ozone;
        supplying hydrogen peroxide; and
        generating the OH radical by reacting the ozone and the hydrogen peroxide,
    wherein the supplying of the hydrogen peroxide comprises supplying the hydrogen peroxide that is evaporated from hydrogen peroxide water.

2. The method of claim 1, wherein the supplying of the ozone comprises supplying gaseous ozone.

3. The method of claim 1, wherein the supplying of the hydrogen peroxide comprises supplying the hydrogen peroxide that is evaporated from 5% to 100% concentrated hydrogen peroxide water.

4. The method of claim 1, wherein the forming of the thin oxide film repeatedly comprises the supplying of the metallic precursors to the substrate and the supplying of the reactant, which contains the OH radical, to the substrate.

5. The method of claim 1, wherein the forming of the thin oxide film comprises:
    introducing a substrate into a chamber;

supplying the metallic precursors into the chamber;
supplying a purge gas into the chamber;
supplying the reactant, which contains the OH radical, into the chamber; and
supplying a purge gas into the chamber.

6. The method of claim 1, wherein the substrate is a silicon substrate or a silicon oxide substrate.

7. The method of claim 1, wherein the metallic precursors include trimethylaluminum (TMA), tris(dimethylmaino)cyclopentadienyl zirconium, tetrakisdimethylamido titanium (TDMATi), demethyl zinc, tetrakisdiethylamido zirconium (TEMAZr), pentaetoxy tantalum (PET), tetrakisdimethylamido hafnium (TDMAHf), or a mixture.

8. An apparatus for forming a thin oxide film, the apparatus comprising:
a chamber;
a precursor supply part configured to supply metallic precursors into the chamber; and
a reactant supply part configured to supply a reactant, which contains an OH radical, into the chamber,
wherein the reactant supply part comprises:
a first supply part configured to supply ozone; and
a second supply part configured to supply hydrogen peroxide,
an OH-radical generation part connected with the first supply part and the second supply part, and configured to react the ozone with the hydrogen peroxide to generate an OH radical that is to be supplied into the chamber, and
wherein the second supply part supplies hydrogen peroxide that is evaporated from hydrogen peroxide water.

9. The apparatus of claim 8, wherein the first supply part supplies the ozone in a gaseous state.

10. The apparatus of claim 8, wherein the second supply part supplies hydrogen peroxide that is evaporated from 5% to 100% concentrated hydrogen peroxide water.

11. The apparatus of claim 8, wherein the second supply part further comprises a heating unit configured to generate hydrogen peroxide by heating 5% to 100% concentrated hydrogen peroxide water.

* * * * *